(12) United States Patent
Taban

(10) Patent No.: US 6,779,348 B2
(45) Date of Patent: Aug. 24, 2004

(54) THERMOELECTRICALLY CONTROLLED BLOWER

(75) Inventor: Vahid Taban, Chino Hills, CA (US)

(73) Assignee: Tandis, Inc., Anaheim, CA (US)

( * ) Notice: Subject to any disclaimer, the term of this patent is extended or adjusted under 35 U.S.C. 154(b) by 0 days.

(21) Appl. No.: 10/286,853

(22) Filed: Nov. 4, 2002

(65) Prior Publication Data

US 2004/0083740 A1 May 6, 2004

(51) Int. Cl.$^7$ .......................... F25B 21/02; F25D 17/06
(52) U.S. Cl. ............................................. 62/3.2; 62/428
(58) Field of Search ............................. 62/3.2, 3.3, 3.7, 62/426, 428, 186; 454/338

(56) References Cited

U.S. PATENT DOCUMENTS

| | | | | |
|---|---|---|---|---|
| 4,665,707 A | * | 5/1987 | Hamilton | 62/3.3 |
| 4,955,203 A | * | 9/1990 | Sundhar | 62/3.61 |
| 5,524,439 A | | 6/1996 | Gallup et al. | 62/3.5 |
| 5,626,021 A | | 5/1997 | Karunasiri et al. | 62/3.5 |
| 6,119,463 A | | 9/2000 | Bell | 62/3.7 |
| 6,223,539 B1 | | 5/2001 | Bell | 62/3.7 |
| 2003/0153260 A1 | * | 8/2003 | Kristensson | 454/338 |

* cited by examiner

Primary Examiner—Chen Wen Jiang
(74) Attorney, Agent, or Firm—Morland C. Fischer

(57) ABSTRACT

A compact, energy efficient blower that is controlled by a Peltier thermoelectric device to supply either hot or cold air. The Peltier device is sandwiched between a pair of heat exchangers that are surrounded by a plastic enclosure. Each heat exchanger includes a plurality of parallel aligned thermal energy conducting fins that are folded to maximize the surface area thereof. A fan is mounted atop the enclosure to pump a first supply of intake air through a first air flow path in a first heat exchanger at one side of the Peltier device to exhaust the waste energy emitted by the Peltier device and collected by the first heat exchanger. The fan also pumps a second supply of intake air through a second air flow path in the second heat exchanger at the opposite side of the Peltier device to blow the useful energy emitted by the Peltier device and collected by the second heat exchanger to an application device or a space within which the blower is located. The first and second heat exchangers are turned upside down relative to one another at opposite sides of the Peltier device so that the waste energy and useful energy are pumped from the blower in directions which are aligned perpendicular to one another.

20 Claims, 3 Drawing Sheets

THERMOELECTRICALLY CONTROLLED BLOWER

BACKGROUND OF THE INVENTION

1. Field of the Invention

This invention relates to a compact, energy efficient blower that includes a pair of folded fin heat exchanger cores located at opposite sides of a conventional Peltier thermoelectric device so that a small area (e.g. a workstation or the passenger compartment of a motor vehicle or airplane) can be effectively heated or cooled by simply adjusting the DC power supply to which the Peltier device is connected.

2. Background Art

With energy conservation on the minds of consumers and government officials alike, efforts have been made to efficiently heat and cool a relative small space, whether it be a workstation, a bedroom, a passenger compartment in a motor vehicle or airplane, etc. To maximize the efficiency of conventional heaters and coolers, heat exchangers have sometimes been used in combination with a fan or blower. However, such heater/cooler combinations have typically required many parts which increases both the manufacturing and assembly (i.e. labor) costs.

In addition, a relatively long linear air flow path which extends between the air intake and output ends is common in the usual heat exchanger. Because this linear air flow path has the intake and output ends lying opposite one another, it has been difficult to increase the heat conductive surface area of the heat exchanger without also significantly increasing the size, material consumption and manufacturing costs. What is even more, heat exchangers having the aforementioned linear flow path are known to experience a relatively high head pressure at the intake end and a pressure drop between the opposing intake and output ends. To overcome these pressure concerns and maintain a sufficient volume of air flowing through the heat exchanger, an air delivery system containing air transport conduits is often employed to carry high pressure air from the fan or blower to the intake end of the heat exchanger. Such an air delivery system typically consumes space and further increases costs and, in some cases, is known to raise the head pressure at the air intake end which may adversely affect the flow rate.

Examples of air moving systems that are controlled by a Peltier thermoelectric device are available by referring to one or more of the following United States patents:

| | |
|---|---|
| 5,524,439 | Jun. 11, 1996 |
| 5,626,021 | May 6, 1997 |
| 6,119,463 | Sep. 19, 2000 |
| 6,223,539 | May 1, 2001 |

SUMMARY OF THE INVENTION

In general terms, a compact, energy efficient blower is disclosed that is controlled by means of a conventional Peltier thermoelectric device. The Peltier device is sandwiched between a pair of folded fin heat exchanger cores and the sandwich is surrounded by a plastic enclosure comprising top and bottom shells. A pair of electrical conductors extends from the Peltier device through the plastic enclosure to be connected to opposite terminals of a DC voltage source by which to power the Peltier device. A lower one of the pair of heat exchanger cores is received within the bottom shell of the enclosure, and the upper one of the heat exchanger cores is received within the top shell. The top and bottom shells are connected one above the other and a (e.g. muffin) fan is secured to the top shell as to lie above the upper heat exchanger core. The top shell of the blower enclosure includes a central air duct and outer air channels. The central air duct of the top shell is axially aligned with the fan and the upper heat exchanger core so that a first portion of fan air can be pumped through a first air flow path that is established by the upper core. The outer air channels of the top shell are aligned with the fan and the lower heat exchanger core so that the rest of the fan air can be pumped through a second air flow path that is established by the lower core.

The upper and lower heat exchanger cores are substantially identical to one another and include a plurality of heat conductive fins that are aligned side-by-side one another. Each heat conductive fin of the plurality of fins is folded to maximize the surface area thereof. Each heat exchanger core includes an open top, a closed bottom and open opposite sides. A plurality of the folded heat conductive fins extends laterally between the open opposite sides of each of the upper and lower heat exchanger cores.

In the assembled blower configuration, the upper and lower folded fin heat exchanger cores which lie at opposite sides of the Peltier thermoelectric device are turned upside down relative to one another. In other words, the open top of the upper heat exchanger core faces upwardly towards the fan at the top of the blower, while the open top of the lower heat exchanger core faces downwardly towards a vent formed in the bottom shell. Moreover, the plurality of folded heat conductive fins of the upper heat exchanger core are arranged in perpendicular alignment with the folded heat conductive fins of the lower heat exchanger core. The first portion of air is pumped by the fan through the first air flow path established by the upper folded heat exchanger core by way of the central air duct in the top shell of the blower enclosure, whereby the waste energy that is emitted by the Peltier thermoelectric device and collected by the upper heat exchanger core is exhausted to the atmosphere via the open opposite sides of the upper heat exchanger core and a pair of windows formed in opposite ends of the top shell. The remaining portion of the air is pumped by the fan through the second air flow path established by the lower heat exchanger core by way of the outer air channels in the top shell of the blower enclosure, whereby the useful work producing energy that is emitted by the Peltier device and collected by the lower heat exchanger core is exhausted from the blower via the open top of the lower heat exchanger core and the vent formed in the bottom shell. The useful energy (e.g. either hot or cold air) produced by the blower can be delivered directly to a user (in the form of a personal air conditioner/heater) or supplied to a workstation or to the passenger compartment of a motor vehicle or airplane. Because the upper and lower heat exchanger cores are turned upside down at opposite sides of the Peltier device, the waste air and useful air are exhausted from the blower in directions that are perpendicular to one another.

DETAILED DESCRIPTION

The thermoelectrically controlled blower 50 which forms the present invention is shown in FIGS. 3–8 of the drawings. As will be described when referring to FIGS. 3–8, the blower 50 includes a thermoelectric device 40 that is sandwiched between a pair of folded fin heat exchanger cores 30 and 31. The folded fin heat exchanger cores 30 and 31 include an open top, a closed bottom and open opposite sides and are substantially identical to one another and to the heat exchanger core that is shown and described in my co-pending patent application Ser. No. 10/228,565 filed Aug. 28, 2002, the teaching of which are incorporated herein by reference.

Figure 1:
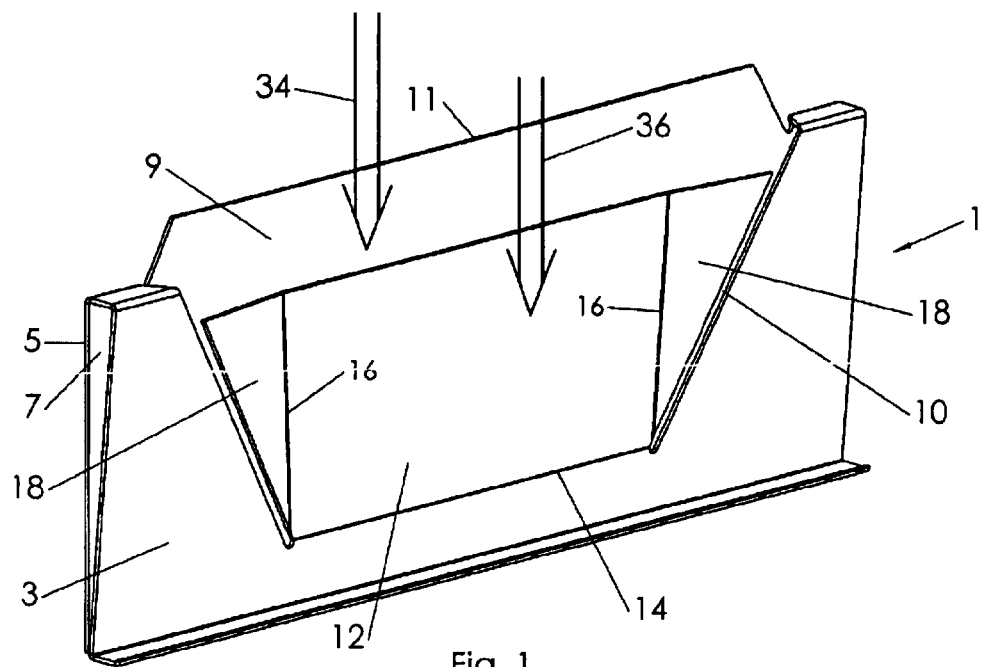
FIG. 1 is a perspective view showing a single folded heat conductive fin from a plurality of fins which form each of the upper and lower heat exchanger cores for the thermoelectrically controlled blower of the present invention.
Figure 2:
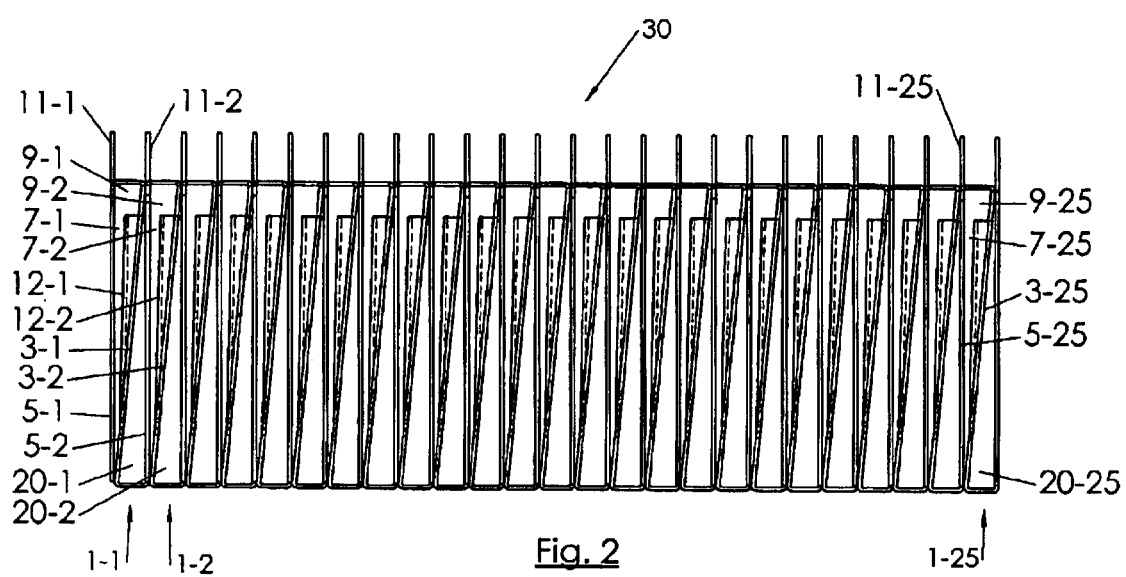
FIG. 2 shows a side view of, for example, the upper heat exchanger core comprising a plurality of the folded heat conductive fins of FIG. 1.

Nevertheless, a brief description of one of the pair of folded fin heat exchanger cores (e.g. 30) is provided while referring to FIGS. 1 and 2 of the drawings, where FIG. 1 illustrates a single heat conductive (e.g. copper) fin 1 and FIG. 2 illustrates a plurality of the heat conductive fins (designated 1-1 . . . 1-25) aligned side-by-side one another to form the heat exchanger core 30. Turning first to FIG. 1, each heat conductive fin 1 of the heat exchanger core 30 is folded to include a front face 3 and a rear face 5 that are spaced from one another and squeezed together at their bottom ends to establish a triangular shaped primary air flow cavity 7. The primary air cavity 7 runs laterally through the interior of the folded heat conductive fin 1 between the front and rear faces 3 and 5 thereof so as to communicate with the atmosphere at the open opposite sides of the fin. The top of each folded fin 1 is also open to create a vertically extending air flow cavity 9 that communicates at the interior of the folded fin 1 with the primary laterally extending air flow cavity 7. A supply of fan air is guided into the vertically extending air flow cavity 9 at the top of fin 1 by means of an outer air blade 11 that projects upwardly from the rear face 5 of fin 1. Thus, it may be appreciated that the primary laterally extending air flow cavity 7 and the vertically extending air flow cavity 9 are aligned at 90 degrees relative to one another to establish a perpendicular air flow path running between the open top and open sides of the folded heat conductive fin 1.

An opening 10 is cut into the front face 3 of the fin 1, and the cut out surface is bent rearwardly towards the rear face 5 along a fold line 14 so as to create an inner air blade 12 that functions as an air splitter. The opposite sides of the inner air blade 12 are bent forwardly towards the front face 3 along fold lines 16 to form side flaps 18 which act to focus some of the supply of fan air against the inner air blade 12. More particularly, a first portion 34 of the fan air that is supplied to the top of the heat conductive fin 1 is blown downwardly through the vertically extending air flow cavity 9 and outwardly from opposite sides of the fin 1 via the primary laterally extending air flow cavity 7. The remaining portion 36 of the fan air that is supplied to the top of the fin 1 will be directed against the rearwardly bent inner air blade 12. That is to say, the supply of fan intake air is split by the air blade 12 such that the remaining portion 36 is diverted into a triangular shaped supplemental laterally extending air flow cavity (designated 20-1 in FIG. 2) via the opening that is cut into the front face 3 of the fin 1 to form the rearwardly bent inner air blade 12. As is best shown in FIG. 2, the supplemental laterally extending air flow cavity 20-1 is established between the front face 3-1 of a first heat conductive fin 1-1 and the rear face 5-2 of an immediately adjacent fin 1-2.

Turning now to FIG. 2, each heat exchanger core (e.g. 30) for the thermoelectrically controlled blower of this invention is shown including a plurality (e.g. a total of 25 in this case) of the aforementioned folded heat conductive fins 1-1 . . . 1-25, such that primary 7-1 . . . 7-25 and supplemental 20-1 . . . 20-25 air flow cavities extend laterally and side-by-side one another through successive pairs of fins. Each vertically extending air flow cavity 9-1 . . . 9-25 that receives a supply of fan intake air through the open top of each of the heat conductive fins (e.g. 1-1) is formed between the upstanding outer air blades 11-1 and 11-2 at the rear faces 5-1 and 5-2 of a pair of adjacent fins (e.g. 1-1 and 1-2).

By virtue of the foregoing, the pair of folded fin heat exchanger cores 30 and 31 of the thermoelectrically controlled blower 50 of FIGS. 3–8 will be characterized by optimized air flow and a maximized use of heat conductive material and corresponding surface area. Accordingly, and as will now be explained, the thermal characteristics and efficiency of the blower 50 will be enhanced relative to conventional blower configurations.

Figure 3:
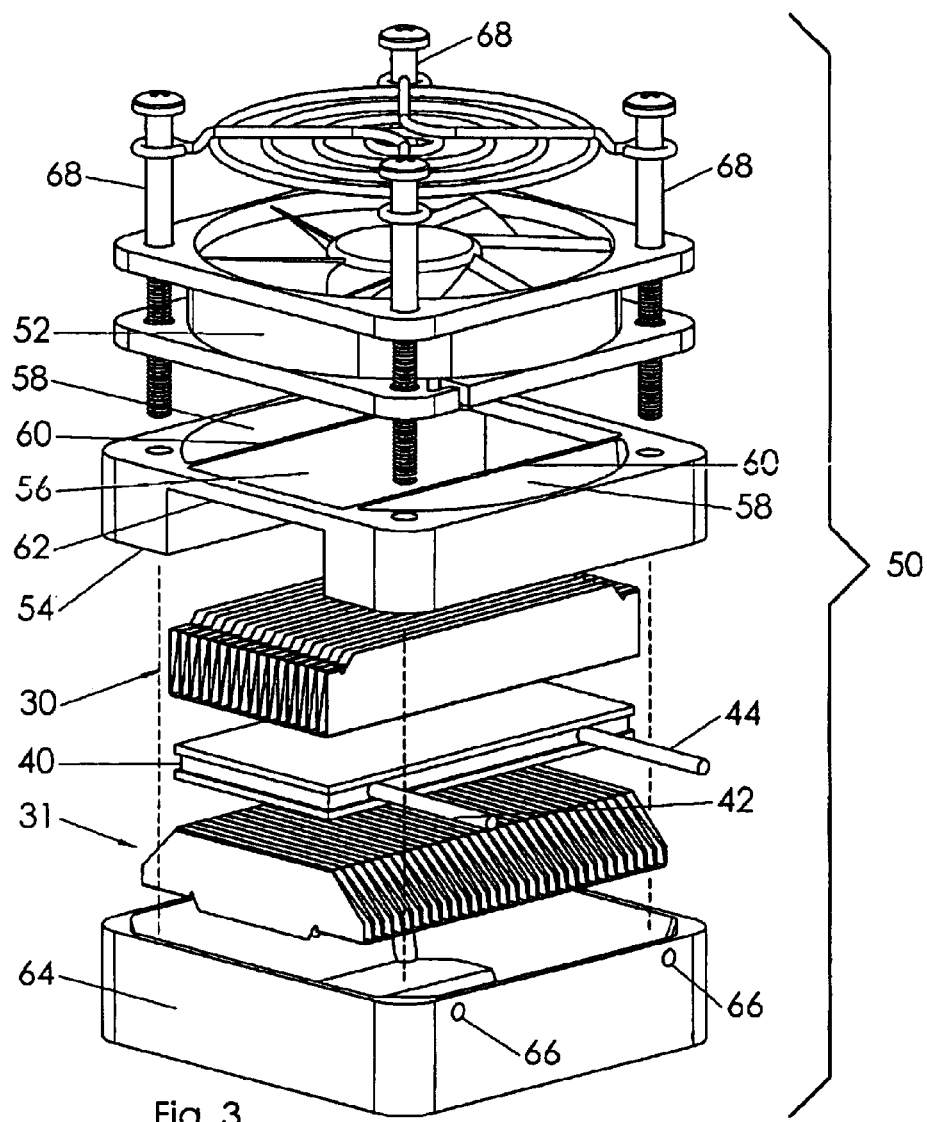
FIG. 3 shows an exploded view of the thermoelectrically controlled blower of this invention.
Figure 4:
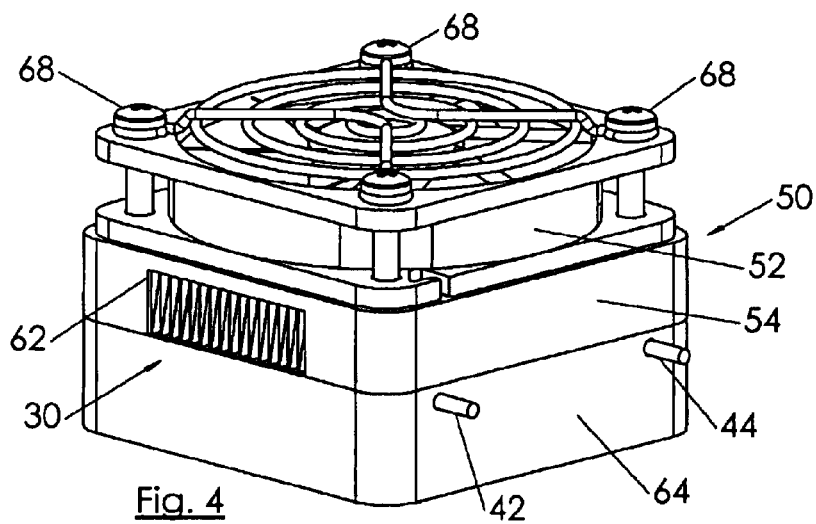
FIG. 4 shows the thermoelectrically controlled blower of FIG. 3 in the assembled configuration.

The thermoelectrically controlled blower 50 of this invention is now described while referring to the exploded and assembled configurations of FIGS. 3 and 4 of the drawings, respectively. As is best shown in FIG. 3, a thermoelectric device 40, often referred to as a Peltier device, is sandwiched between a pair of the upper and lower folded fin heat exchanger cores 30 and 31 that were previously described when referring to FIGS. 1 and 2. The Peltier thermoelectric device 40 is a well known voltage controlled device that is commercially available from different sources, including FerroTec. The Peltier thermoelectric device 40 includes a pair of electrical conductors (e.g. wires) 42 and 44 that are to be connected to opposite terminals of a DC voltage source (not shown), such as a 12 volt battery.

The heat exchanger cores 30 and 31 are identical, except that each of the front and rear faces 3-1 . . . 3-25 and 5-1 . . . 5-25 of the folded heat conductive fins 1-1 . . . 1-25 (of FIGS. 1 and 2) of the upper core 30 have square top and bottom corners, while the front and rear faces of the fins of the lower core 31 have ramp-shaped bottom corners. The front and rear faces 3-1 . . . 3-25 and 5-1 . . . 5-25 of the folded fins 1-1 . . . 1-25 of upper core 30 are provided with square corners to maximize the thermally conductive surface area thereof and improve the air channeling as a supply of fan intake air is directed into the vertically extending air flow cavities 9-1 . . . 9-25 (of FIGS. 1 and 2) of the core 30. The bottom corners of the front and rear faces of the fins of lower core 31 are ramp-shaped for the purpose of establishing an air flow path for the supply of fan intake air in the manner shown in FIG. 8.

In addition, and as is also best shown in FIG. 3, the lower heat exchanger core 31 is rotated 90 degrees and turned upside down relative to the upper heat exchanger core 30. That is, the folded heat conductive fins 1-1 . . . 1-25 of the upper core 30 and the folded heat conductive fins of the lower core 31 are perpendicularly aligned with one another for a purpose that will be described in greater detail hereinafter when referring to FIGS. 5–8.

A fan 52 (e.g. a conventional muffin fan) is securely mounted so as to lie immediately above the upper heat exchanger core 30 whereby a supply of fan air will be blown downwardly and directly into the vertically extending air flow cavities 9-1 . . . 9-25 of the folded fins 1-1 . . . 1-25 thereof. The fan 52 is secured to a top shell 54 of a plastic enclosure for the blower 50. As an important detail of the blower 50, the top shell 54 is manufactured to include a relatively wide central air duct 56 and a pair of relatively narrow outer air channels 58. The central air duct 56 is separated from the outer air channels 58 by dividers or walls 60 that extend therebetween so as to divide or split the supply of air that is delivered by the fan 52 to the upper and lower heat exchanger cores 30 and 31.

In the assembled blower configuration of FIG. 4, the upper folded fin heat exchanger core 30 is seated atop the Peltier thermoelectric device 40. The top shell 54 of the plastic enclosure for blower 50 is sized to surround the upper heat exchanger core 30. A window 62 is formed in each of the opposite ends of the top shell 54 to accommodate the upper heat exchanger core 30 therebetween and to enable the open sides of the folded fins 1-1 . . . 1-25 of heat exchanger core 30 to communicate with the atmosphere surrounding the blower 50.

The central air duct 56 through the top shell 54 is positioned in axial alignment with the fan 52 and the folded fins 1-1 . . . 1-25 of the upper heat exchanger core 30. Thus, and as will be explained in greater detail when referring to FIG. 7, a first air flow path will be established for blower 50 from the fan 52, through the central air duct 56 of top shell 54, downwardly into the open tops of the folded fins of upper heat exchanger core 30 via the vertically extending air flow cavities thereof (designated 9-1 . . . 9-25 in FIG. 2), and outwardly at the open sides of the folded fins of core 30 to be exhausted to the atmosphere via the primary and secondary laterally extending air flow cavities (designated 7-1 . . . 7-25 and 20-1 . . . 20-25 in FIG. 2) and the opposing windows 62 of top shell 54.

The lower folded fin heat exchanger core 31 is disposed within a bottom shell 64 of the plastic enclosure for blower 50. A pair of ports 66 are formed through the bottom shell 64. In the assembled blower configuration of FIG. 4, the Peltier thermoelectric device 40 is seated atop the lower heat exchanger core 31 such that the electrical conductors 42 and 44 of device 40 are received through respective ports 66. In this same regard, and to achieve the advantages of this invention, the Peltier thermoelectric device 40 must be sized so as not to cover the ramp-shaped bottom corners of the folded fins of the lower heat exchanger core 31 upon which device 40 is seated.

As was previously described, the folded heat conductive fins of the upper heat exchanger core 30 that is located above the Peltier thermoelectric device 40 are positioned in perpendicular alignment with the folded heat conductive fins of the lower heat exchanger core 31 that is located below device 40. Moreover, the upper and lower folded fin heat exchanger cores 30 and 31 are turned upside down relative to one another. That is to say, the open tops of the folded fins of upper heat exchanger core 30 face upwardly towards the fan 52 secured to the top shell 54 at the top of blower 50, while the open tops of the folded fins of lower heat exchanger core 31 face downwardly towards the bottom of blower 50 and a vent (designated 72 in FIG. 6) that is formed in the bottom shell 64.

The outer air channels 58 through the top shell 54 are positioned in alignment with the fan 52 and the uncovered ramp-shaped bottom corners of the folded fins of the lower heat exchanger core 31. Accordingly, and as will be explained in greater detail when referring to FIG. 7, a second air flow path is established for blower 50 from the fan 52, through the outer air channels 58 of top shell 52, into the primary and secondary laterally extending air flow cavities of the folded fins of lower heat exchanger core 31 via the ramp-shaped bottom corners at the open sides of core 31, and downwardly towards the aforementioned vent (designated 72 in FIG. 6) that is formed in the bottom shell 64 to be exhausted to an application device or area via the vertically extending air flow cavities at the open tops of the folded fins of the inverted lower heat exchanger core 31. To this end, it may be appreciated that the divider walls 60 of the top shell 54 that separate the central air duct 56 from the outer air channels 58 function to split the supply of intake air to be pumped by the fan 52 through the first (FIG. 8) and the second (FIG. 7) air flow paths of blower 50.

The assembled arrangement of the Peltier thermoelectric device 40 sandwiched between the inverted upper and lower folded fin heat exchanger cores 30 and 31 and the attachment of fan 52 so as to be securely mounted to the top shell 54 and thereby lie in axially alignment with each of the central air duct 56 and the outer air channels 58 is maintained by means of fasteners (e.g. elongated threaded bolts) 68. The fasteners 68 are received through axially aligned bolt holes formed in the housing for fan 52 and the top and bottom shells 54 and 64. Accordingly, the top and bottom shells 54 and 64 will be connected together one above the other to complete the enclosure for the thermoelectrically controlled blower 50, whereby to surround the upper and lower heat exchanger cores 30 and 31 and enable the first and second air flow paths established by cores 30 and 31 to communicate with the atmosphere or an application device or area through the windows 62 that are formed at the opposite ends of the upper shell 54 and the vent 72 (of FIG. 6) that is formed in the bottom of lower shell 64.

Figure 5:
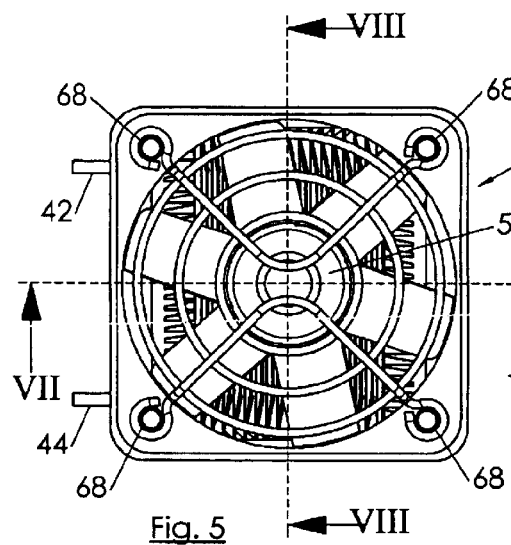
FIG. 5 is an top plan view of the thermoelectrically controlled blower showing a fan secured to the top thereof.
Figure 6:
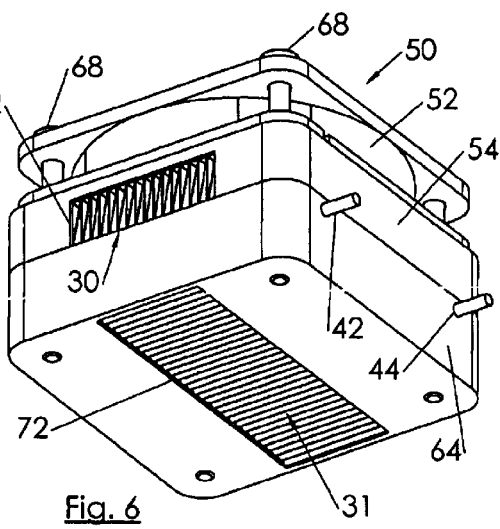
FIG. 6 is a perspective view of the thermoelectrically controlled blower showing a window at the side and a vent at the bottom through which waste and useful energy is exhausted.

The operation of the thermoelectrically controlled blower 50 of this invention is now disclosed while referring concurrently to FIGS. 5–8 of the drawings. FIG. 5 shows the fan 52 mounted at the top of blower 50 to pump air through the first and second air flow paths that are established by the upper and lower folded fin heat exchanger cores 30 and 31 between which the Peltier thermoelectric device 40 is sandwiched. FIG. 6 shows the upper and lower heat exchanger cores 30 and 31 enclosed by the top and bottom shells 54 and 64 of blower 50, whereby the fan air (designated 74 in FIG. 8) that is blown through the first air flow path established by the upper core 30 is exhausted to the atmosphere at the windows 62 that are formed in opposite ends of the top shell 54. In this same regard, the fan air (designated 78 in FIG. 7) that is blown through the second air flow path that is established by the lower core 31 is exhausted to an application device or area at the vent 72 that is formed in the bottom of the bottom shell 64.

Figure 8:
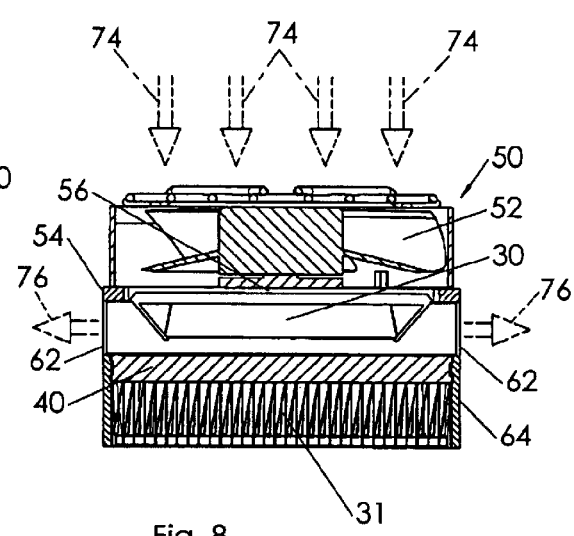
FIG. 8 is a cross-section taken along lines 8—8 of FIG. 5 showing a second air flow path through the second heat exchanger core of the blower.

Turning now to FIG. 8, the upper folded fin heat exchanger core 30 is shown seated atop the Peltier thermoelectric device 40 so that some of the intake air supply that is generated by the fan 52 will be pumped into the open tops of the folded fins of core 30 and through the first air flow path established thereby. As was previously explained, a first supply of fan air 74 will be blown through the central air duct 56 of the top shell 54 and into the top of the upper heat exchanger core 30 at the vertically extending air flow cavities (designated 9-1 . . . 9-25 in FIG. 2) of the folded fins thereof. The fan intake air 74 will then be blown downwardly through air flow cavities 9-1 . . . 9-25 and into the perpendicularly aligned primary and supplemental laterally extending air flow cavities (designated 7-1 . . . 7-25 and 20-1 . . . 20-25 in FIG. 2), whereby to collect the waste energy (i.e. energy that is not intended to be used by an application device or area with which the blower 50 is associated) that is emitted by the Peltier thermoelectric device 40. The fan air 74 and waste energy collected by heat exchanger core 30 will be blown outwardly into the atmosphere surrounding blower 50 from the windows 62 as exhaust air 76 via the open sides of the folded fins of upper heat exchanger core 30.

Figure 7:
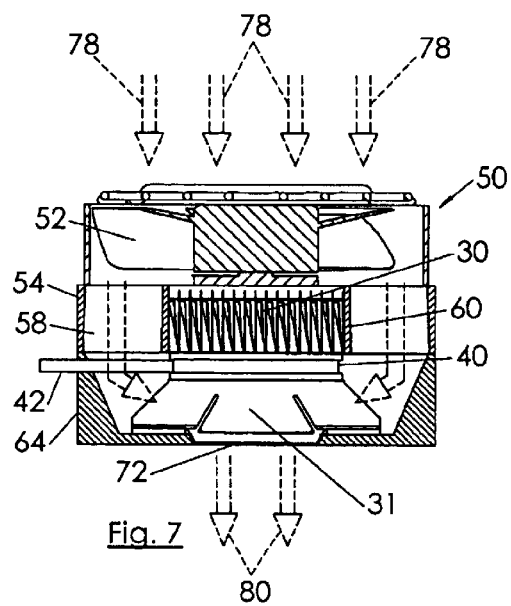
FIG. 7 is a cross-section taken along lines 7—7 of FIG. 5 showing a first air flow path through the first heat exchanger core of the blower.

Turning now to FIG. 7, the Peltier thermoelectric device 40 is shown seated atop the inverted lower folded fin heat exchanger core 31 so that the rest of the intake air supply that is generated by the fan 52 will be pumped into the open sides of the folded fins of lower core 31 and through the second air flow path established thereby. More particularly, and as was previously explained, the remaining supply of fan intake air 78 will be blown through the outer air channels 58 of the top shell 54, into the open sides of the folded fins of lower core 31, and through the laterally extending primary and supplemental air flow cavities (similar to those designated 7-1 . . . 7-25 and 20-1 . . . 20-25 in FIG. 2) in the direction illustrated by the broken lines in FIG. 7, whereby to collect the useful energy (i.e. energy that is intended to be delivered to an application device or area with which blower 50 is associated) that is emitted by the Peltier thermoelectric device 40. The fan air 78 and useful energy collected from heat exchanger core 31 will then be blown into the vertically extending air flow cavities (similar to those designated 9-1 . . . 9-25 in FIG. 2) at the open tops of the folded fins of the lower heat exchanger core 31.

It was also previously explained that the upper and lower folded fin heat exchanger cores 30 and 31 at opposite sides of the thermoelectric device 40 are inverted (i.e. turned upside down) relative to one another. Therefore, while the vertically extending air flow cavities 9-1 . . . 9-25 of the folded fins 1-1 . . . 1-25 of the upper heat exchanger core 30 shown in FIG. 7 are axially aligned with the fan 52 at the top of blower 50 to receive fan air 74, the vertically extending air flow cavities of the folded fins of the inverted lower heat exchanger core 31 shown in FIG. 8 are axially aligned with the vent 72 at the bottom of blower 50. Accordingly, the useful energy collected from Peltier thermoelectric device 40 will be blown outwardly from the bottom of blower 50 at the vent 72 thereof as work producing air 80 via the open tops of the folded fins of the inverted lower heat exchanger core 31.

It may be appreciated that the waste air 76 and the useful air 80 that are exhausted from the windows 62 and vent 72 of blower 50 are blown outwardly therefrom in directions which are perpendicular relative to one another. The waste air 76 may be simply dissipated in the surrounding space within which the blower 50 is located. The useful work producing air 80 that is blown out the bottom of blower 50 (in FIG. 7) can be either hot air or cool air, depending upon the magnitude and the polarity of the DC voltage (and the corresponding DC current) that is supplied to the Peltier thermoelectric device 40 by means of electrical conductors 42 and 44. For example, by reversing the direction of the DC current to device 40, the blower 50 can be transformed from a heat pump, during which the work producing air 80 will be hot, to an air conditioner, during which the work producing air 80 will be cold. In this regard, the thermoelectrically controlled blower 50 of this invention can be used for a variety of applications for efficiently heating and cooling relatively small spaces in both the winter and summer such as, for example, a workstation and the passenger compartments of a motor vehicle or an airplane. However, it is to be understood that the aforementioned examples are but some of the energy saving applications for the thermoelectrically controlled blower 50 of this invention.

I claim:

1. A blower assembly, comprising:

a Peltier thermoelectric device having first and opposite sides and adapted to be connected to a source of power to emit waste thermal energy from the first side thereof and useful thermal energy from the opposite side;

a first heat exchanger located in thermal communication with the first side of said Peltier thermoelectric device to collect the waste thermal energy emitted from said first side, said first heat exchanger having a first air flow path running therethrough;

a second heat exchanger located in thermal communication with the opposite side of said Peltier thermoelectric device to collect the useful thermal energy emitted from said opposite side, said second heat exchanger having a second air flow path running therethrough;

a fan for pumping a first supply of fan air through the first air flow path of said first heat exchanger for exhausting the waste thermal energy emitted from the first side of said Peltier thermoelectric device and collected by said first heat exchanger and a second supply of fan air through the second air flow path of said second heat exchanger for blowing the useful thermal energy emitted from the opposite side of said Peltier thermoelectric device and collected by said second heat exchanger to an application device or a space within which said blower assembly is located; and a housing having an upper housing portion and a lower housing portion, said upper housing portion enclosing said first heat exchanger and said lower housing portion enclosing said second heat exchanger, and said Peltier thermoelectric device being located between said first and second heat exchangers within said housing, and upper housing portion having first and second air passages formed therein and aligned with said fan, said fan pumping said first supply of fan air into the first air passage in said upper housing portion and through the first air flow path of said first heat exchanger enclosed by said upper housing portion and said second supply of fan air into the second air passage in said upper housing portion and through the second air flow path of said second heat exchanger enclosed by said lower housing portion.

2. The blower assembly recited in claim 1, wherein the waste thermal energy emitted by said Peltier device and collected by said first heat exchanger is exhausted from said blower assembly in a first direction and the useful thermal energy emitted by the Peltier device and collected by said second heat exchanger is blown from said blower assembly in a second direction, said first and second directions in which said waste thermal energy is exhausted and said useful thermal energy is blown lying in perpendicular alignment with one another.

3. The blower assembly recited in claim 1, wherein the upper housing portion of said housing has at least one open window formed therein and the lower housing portion of said housing has an open vent formed therein, such that the waste thermal energy emitted by said Peltier device is exhausted from said blower assembly through said open window by means of the first supply of air being pumped through the first air flow path of said first heat exchanger enclosed by said upper housing portion, and the useful thermal energy emitted by said Peltier device is blown from said blower assembly through said open vent by means of the second supply of fan air being pumped through the second air flow path of said second heat exchanger enclosed by said lower shell housing portion.

4. The blower assembly recited in claim 3, wherein said at least one open window is formed in one end of said upper housing portion and said open vent is formed in the bottom of said lower housing portion such that the waste thermal energy is exhausted through said window in a first direction and the useful thermal energy is blown through said vent in second direction which lies in perpendicular alignment with said first direction.

5. The blower assembly recited in claim 1, wherein each of said first and second heat exchangers includes an open top, a closed bottom, open opposite sides, and a plurality of thermal energy conducting fins extending in parallel alignment with one another between said open sides, said first and second heat exchangers turned upside down relative to one another such that the closed bottom of said first heat exchanger lies against the first side of said Peltier device and the closed bottom of said second heat exchanger lies against the opposite side of said Peltier device.

6. The blower assembly recited in claim 5, wherein the plurality of parallel aligned thermal energy conducting fins which extend between the open opposite sides of said first heat exchanger are arranged in perpendicular alignment with the plurality of parallel aligned thermal energy conducting fins which extend between the open opposite sides of said second heat exchanger.

7. The blower assembly recited in claim 6, wherein the first air flow path running through said first heat exchanger is established between the open top of said first heat exchanger into which the first supply of fan air is pumped and the open opposite sides of said first heat exchanger between which said plurality of thermal energy conducting fins extend and from which the waste thermal energy emitted by said Peltier device is exhausted.

8. The blower assembly recited in claim 7, wherein the second air flow path running through said second heat exchanger is established between the open opposite sides of said second heat exchanger between which said plurality of thermal energy conducting fins extend and into which the second supply of fan air is pumped and the open top of said second heat exchanger from which the useful thermal energy emitted by said Peltier device is blown.

9. A blower assembly, comprising:
a Peltier thermoelectric device to be connected to a source of power and adapted to emit thermal waste energy from one side thereof and useful thermal energy from the opposite side;
a first heat exchanger including a first plurality of thermal energy conducting fins lying against the first side of said Peltier thermoelectric device to collect the waste energy emitted from said first side, said first heat exchanger having a first air flow path running therethrough;
a second heat exchanger including a second plurality of thermal energy conducting fins lying against the opposite side of said Peltier thermoelectric device to collect the useful thermal energy emitted from said opposite sides, said second heat exchanger having a second air flow path running therethrough; and
a fan for pumping a first supply of fan air through the first air flow path of said first heat exchanger for exhausting the waste thermal energy emitted from the first side of said Peltier thermoelectric device and collected by said first heat exchanger and a second supply of fan air through the second air flow path of said second heat exchanger for blowing the useful thermal energy emitted from the opposite side of said Peltier thermoelectric device and collected by said second heat exchanger into an application device or a space within which said blower is located,
whereby the waste thermal energy emitted by said Peltier thermoelectric device and collected by said first heat exchanger is exhausted from said blower in a first direction and the useful thermal energy emitted by said Peltier thermoelectric device and collected by said second heat exchanger is blown from said blower in a second direction, said first and second directions in which said waste thermal energy is exhausted and said useful thermal energy is blown lying in perpendicular alignment with one another.

10. The blower assembly recited in claim 9, wherein each thermal energy conducting fin of said first and second pluralities of thermal energy conducting fins has a front face, a back face spaced from said front face, an air exhaust cavity located between said front and back faces, a top connected between said front and back faces, and an opening formed through said top to receive one of said first and second supply of fan air pumped by said fan.

11. The blower assembly recited in claim 10, wherein said opening through the top of each thermal energy conducting fin of said first and second pluralities of thermal energy conducting fins extends in a vertical direction and said air exhaust cavity located between the front and back faces of said fin extends in a horizontal direction, said vertically extending opening communicating with said horizontally extending air exhaust cavity in perpendicular alignment therewith.

12. The blower assembly recited in claim 11, wherein each thermal energy conducting fin of said first and second pluralities of thermal energy conducting fins also has a closed bottom and a pair of open opposite sides, said air exhaust cavity located between said front and back faces and extending laterally between said pair of open opposite sides, such that each of said first and second air flow paths of said first and second heat exchangers includes the vertical opening, the horizontal air exhaust cavity and the open opposite sides of each fin thereof.

13. The blower assembly recited in claim 9, further comprising a housing having an upper shell connected to a lower shell, said upper shell enclosing said first heat exchanger and said lower shell enclosing said second heat exchanger, said Peltier thermoelectric device being sandwiched between said first and second heat exchangers within said housing.

14. The blower assembly recited in claim 13, wherein said fan is mounted above the upper shell of said housing, said upper shell having first and second air passages formed therein and aligned with said fan, said fan pumping said first supply of fan air in to the first air passage in said upper shell and through the first air flow path of said first heat exchanger enclosed by said upper shell and said second supply of fan air into the second air passage in said upper shell and through the second air flow path of said second heat exchanger enclosed by said lower shell.

15. The blower assembly recited in claim 14, wherein the upper shell of said housing has at least one open window formed therein and the lower shell of said housing has an open vent formed therein, such that the waste thermal energy emitted by said Peltier thermoelectric device is exhausted from said blower through said window by means of the first supply of fan air being pumped through the first air flow path of said first heat exchanger enclosed by said upper shell, and the useful thermal energy emitted by said Peltier thermoelectric device is blown from said blower through said vent by means of the second supply of fan air being pumped through the second air flow path of said second heat exchanger enclosed by said lower shell.

16. The blower assembly recited in claim 9, wherein each of said first and second heat exchangers include an open top, a closed bottom, open opposites sides, and one of said first and second pluralities of thermal energy conducting fins extending in parallel alignment between said open opposite sides, said first and second heat exchangers turned upside down relative to one another such that the closed bottom of said first heat exchanger lies against the first side of said Peltier thermoelectric device and the closed bottom of said second heat exchanger lies against the opposite side of said Peltier thermoelectric device.

17. The blower assembly recited in claim 16, wherein said plurality of parallel aligned thermal energy conducting fins which extend between the open opposite sides of said first heat exchanger are arranged in perpendicular alignment with said plurality of parallel aligned thermal energy conducting fins which extend between the open opposite sides of said second heat exchanger.

18. A blower assembly, comprising:
a Peltier thermoelectric device having first and opposite sides and adapted to be connected to a source of power to emit waste thermal energy from the first side thereof and useful thermal energy from the opposite side;
a first heat exchanger located in thermal communication with the first side of said Peltier thermoelectric device to collect the waste thermal energy emitted from said first side, said first heat exchanger having a first air flow path running therethrough;
a second heat exchanger located in thermal communication with the opposite side of said Peltier thermoelectric device to collect the useful thermal energy emitted from said opposite side, said second heat exchanger having a second air flow path running therethrough;
each of said first and second heat exchangers including an open top, a closed bottom, open opposite sides, and a plurality of thermal energy conducting fins extending between said open sides, said first and second heat exchangers turned upside down relative to one another such that the closed bottom of said first heat exchanger lies against the first side of said Peltier thermoelectric device and the closed bottom of said second heat exchanger lies against the opposite side of said Peltier thermoelectric device; and
a fan for pumping a first supply of fan air through the first air flow path of said first heat exchanger for exhausting the waste thermal energy emitted from the first side of said Peltier thermoelectric device and collected by said first heat exchanger and a second supply of fan air through the second air flow path of said second heat exchanger for blowing the useful thermal energy emitted from the opposite side of said Peltier thermoelectric device and collected by said second heat exchanger into an application device or a space within which said blower assembly is located.

19. The blower assembly recited in claim 18, wherein the plurality of thermal energy conducting fins which extend between the open opposite sides of said first heat exchanger are arranged in perpendicular alignment with the plurality of thermal energy conducting fins which extend between the open opposite sides of said second heat exchanger.

20. The blower assembly recited in claim 19, wherein the first air flow path running through said first heat exchanger is established between the open top of said first heat exchanger into which the first supply of fan air is pumped and the open opposite sides of said first heat exchanger between which said plurality of thermal energy conducting fins extend and from which the waste thermal energy emitted by said Peltier device is exhausted, and the second air flow path running through said second heat exchanger is established between the open opposite sides of said second heat exchanger between which said plurality of thermal energy conducting fins extend and into which the second supply of fan air is pumped and the open top of said second heat exchanger from which the useful thermal energy emitted by said Peltier device is blown.

* * * * *